United States Patent
Helwig et al.

(10) Patent No.: US 6,353,548 B2
(45) Date of Patent: Mar. 5, 2002

(54) METHOD AND DATA PROCESSING SYSTEM FOR DATA LOOKUPS

(75) Inventors: Klaus Helwig; Hans-Werner Tast, both of Weil i.Schoenbuch; Friedrich-Christian Wernicke, Holzgerlingen, all of (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/746,983

(22) Filed: Dec. 22, 2000

(30) Foreign Application Priority Data

Dec. 30, 1999 (EP) .............................................. 99126171

(51) Int. Cl.[7] .............................................. G11C 15/00
(52) U.S. Cl. ...................... 365/49; 365/189.07; 365/195
(58) Field of Search .............................. 365/49, 189.07, 365/195

(56) References Cited

U.S. PATENT DOCUMENTS 5,930,359 A * 7/1999 Kempke et al. ............ 365/149
5,946,704 A * 8/1999 Yoneda et al. ................ 365/49
6,175,514 B1 * 1/2001 Henderson et al. ........... 365/49

* cited by examiner

Primary Examiner—Trong Phan
(74) Attorney, Agent, or Firm—Lynn L. Augspurger, Esq.; Blanche E. Schiller, Esq.; Heslin Rothenberg Farley & Mesiti, P.C.

(57) ABSTRACT

In order to provide a more efficient method and system for data lookups, it is proposed to provide the known CAM (100) with an additional comparator (301). The comparator (301) does not comprise a memory circuit and therefore allows a faster comparison of input data (D0 to D31) with compare data (C0 to C31) than the known compare circuit (106). In addition, it is proposed to temporarily inhibit forwarding of the output signal of the specific CAM circuit into which the input data (D0 to D31) are written, in order to avoid forwarding of a wrong match signal to the data processing system.

15 Claims, 7 Drawing Sheets

METHOD AND DATA PROCESSING SYSTEM FOR DATA LOOKUPS

PRIOR FOREIGN APPLICATION

This application claims priority from European patent application number 99126171.0, filed Dec. 30, 1999, which is hereby incorporated herein by reference in its entirety.

TECHNICAL FIELD

The present invention is generally related to a method and a data processing system for data lookups using high-speed memories. More particularly, the present invention relates to a content addressable memory (CAM) or associative content addressable memory, in such a system.

BACKGROUND ART

An associative memory or content addressable memory (CAM) is a memory comprising a plurality of CAM circuits, each comprising a memory circuit and a compare circuit. The CAM is accessed by data content, rather than by the address or location of data.

Figure 1:
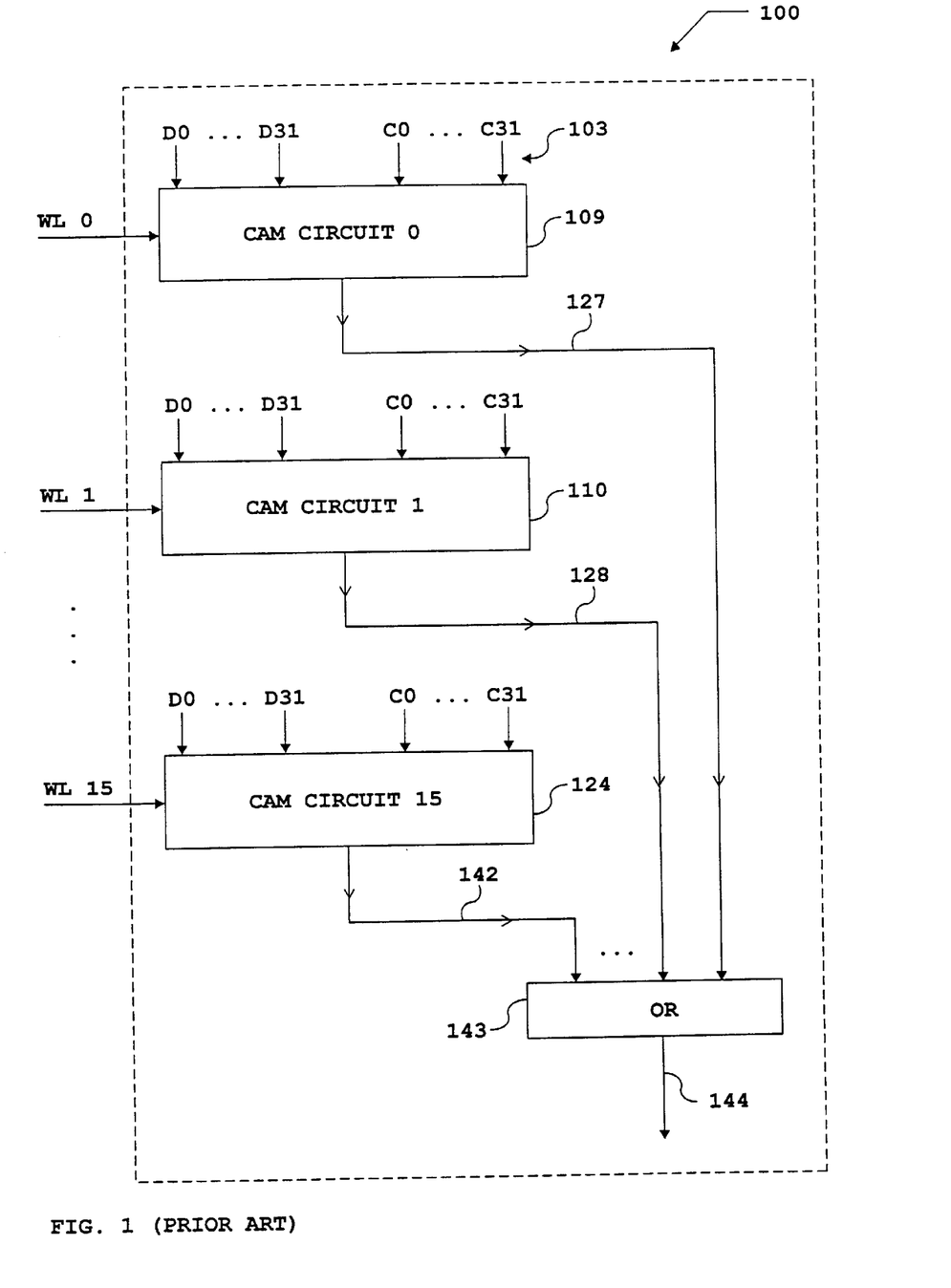
FIG. 1 schematically illustrates a conventional content addressable memory (CAM) comprising a plurality of CAM circuits.

FIG. 1 shows a block diagram of a CAM according to the prior art comprising a plurality of CAM circuits.

Figure 2:
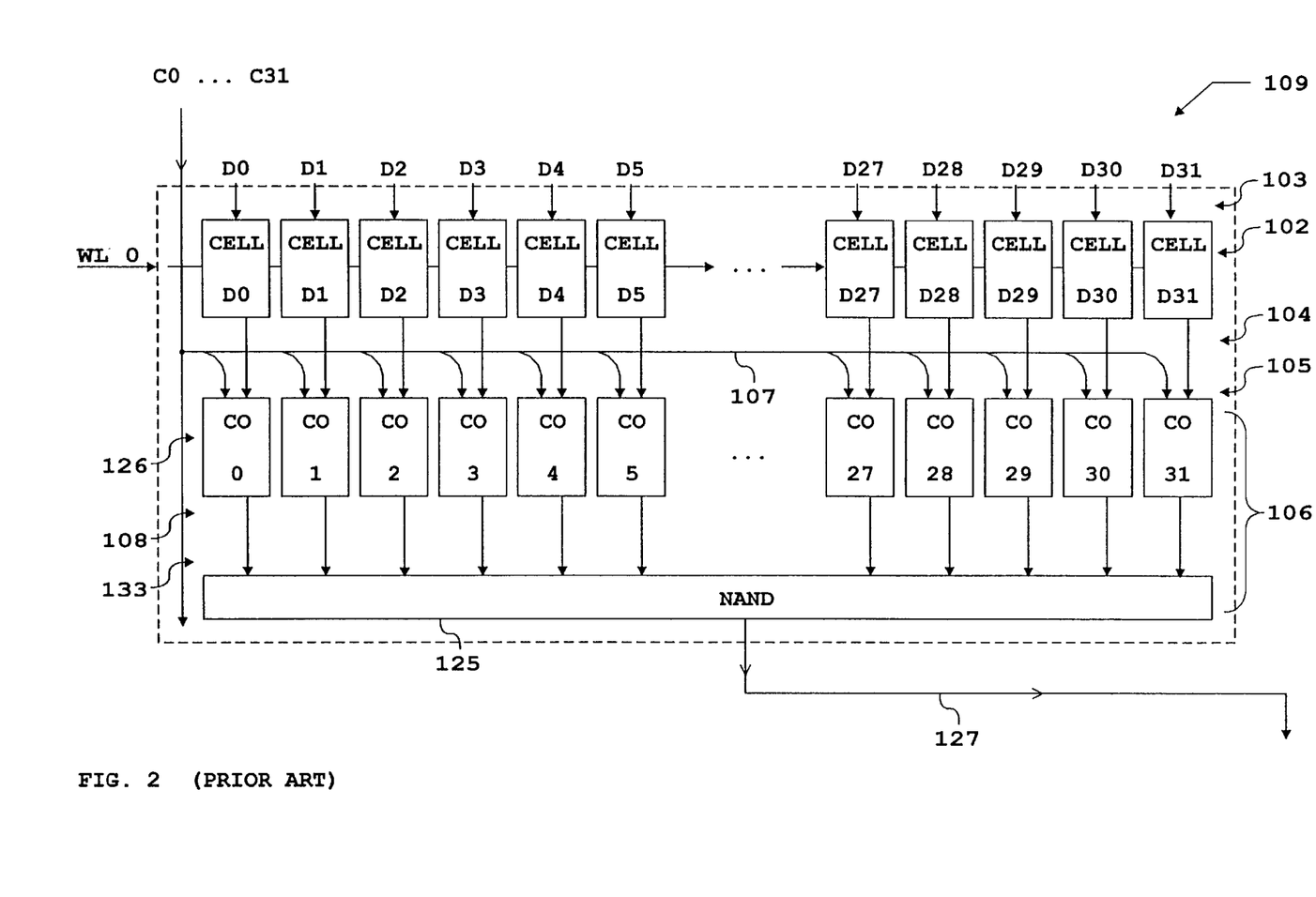
FIG. 2 shows a single CAM circuit of the CAM in FIG. 1 in more detail.

FIG. 2 shows a single CAM circuit of FIG. 1 in more detail.

A known CAM 100 comprises a plurality of identical CAM circuits 109, 110 to 124, such as 16 CAM circuits 0 to 15, and an OR-gate 143, as shown in FIG. 1.

As depicted in FIG. 2, each known CAM circuit 109, 110 to 124 comprises a memory circuit 102 and a compare circuit 106. The memory circuit 102 consists of a memory cell array and the compare circuit 106 comprises a comparator array 126 and a NAND- gate 125. The output of each memory cell (CELL D0 to CELL D31) of the memory circuit 102 is connected with a first input of a corresponding comparator C0 0 to C0 31 in comparator array 126 via output means 104 of the memory circuit 102 and data input means 105 of the compare circuit 106. Compare data C0 to C31, representing the bits of a 32-bit-word, are applied to second inputs of the comparators C0 0 to C0 31 in comparator array 126 via compare data input means 107 of compare circuit 106. The comparators are XOR-gates, i.e. exclusive OR-gates. Via input means 103 of memory circuit 102 input data D0 to D31, also representing the bits of a 32-bit-word, and to be stored in the memory circuit 102, are applied to input means 103 of the memory circuit 102. Each bit of the input data D0 to D31 is stored in a corresponding memory cell of the memory circuit 102, if a write signal is applied to a write line 0 (WL 0) of the CAM circuit 0 (109). The write signal enables writing into the memory cells.

In the following, the operation of known CAM circuit 0 (109) will be described in more detail. It shall be assumed that input data have already been stored in the memory cells of memory circuit 102 in a first step or cycle. Accordingly, each memory cell stores one bit of the input data.

In a second step or cycle, input data D0 to D31 are applied to the input means 103 of memory circuit 102 and a write signal is applied to word line 0 (WL 0) enabling storage of the second input data D0 to D31 in the memory cells (CELL D0 to CELL D31) of the memory circuit 102.

Since it takes a certain time until the first input data stored in said memory circuit 102 are substituted by the applied second input data D0 to D31 in the memory cells, the data status of each memory cell and accordingly of the memory circuit 102 is not defined in the step of storing the second input data D0 to D31. Accordingly, it is necessary to wait a certain time, until the outputs of all memory cells comprise a defined status, i.e. the outputs represent the second input data D0 to D31. Although the waiting period depends on the characteristics of the memory cells, a typical period lasts at least about to the same time it takes to perform a compare operation. This time has to pass before the compare operation can be started and a comparison result may be used for further processing.

Otherwise, it cannot be made sure that a comparison of the data present in memory circuit 102 with the compare data C0 to C31 by the comparator array 126 is a comparison of the second input data D0 to D31 with the compare data C0 to C31.

Each comparator of comparator array 126 generates an output signal indicating whether its applied input bit (0-bit or 1-bit, i.e. a low-level signal or a high-level signal) is identical to its applied compare bit (also a 0-bit or a 1-bit, i.e. a low-level signal or a high-level signal). The output signal or comparison result of each comparator of comparator array 126 is applied to a corresponding input of the NAND-gate 125, which performs a logical AND-operation with the output signals of all comparators and inverts the output signal on the single output line 127 of the NAND-gate 125.

As shown in FIG. 1, each line 127, 128 to 142 of the CAM circuits 0 to 15 is applied to a corresponding input of the OR-gate 143, which comprises a single output line 144 forwarding a match signal generated by at least one of the CAM circuits 0, 1, ..., 15 (109, 110, ..., 124) to a data processing system (not shown) comprising the known CAM 100 for further processing.

SUMMARY OF THE INVENTION

It is an object of the present invention to provide a more efficient method and data processing system for data lookups.

It is another object of the present invention to provide a method and a data processing system using a content addressable memory, which is more efficient.

It is yet another object of the present invention to provide a method and a data processing system comprising a content addressable memory that performs a comparison of input data and compare data within a lower amount of clock cycles or steps, or within a shorter cycle.

BRIEF DESCRIPTION OF THE DRAWINGS

For a more complete understanding of the present invention, and the advantages thereof, reference is now made to the following descriptions taken in conjunction with the accompanying drawings in which the same reference signs have been used for the same parts or parts with the same or a similar effect, and in which.

BEST MODE FOR CARRYING OUT THE INVENTION

Figure 3:
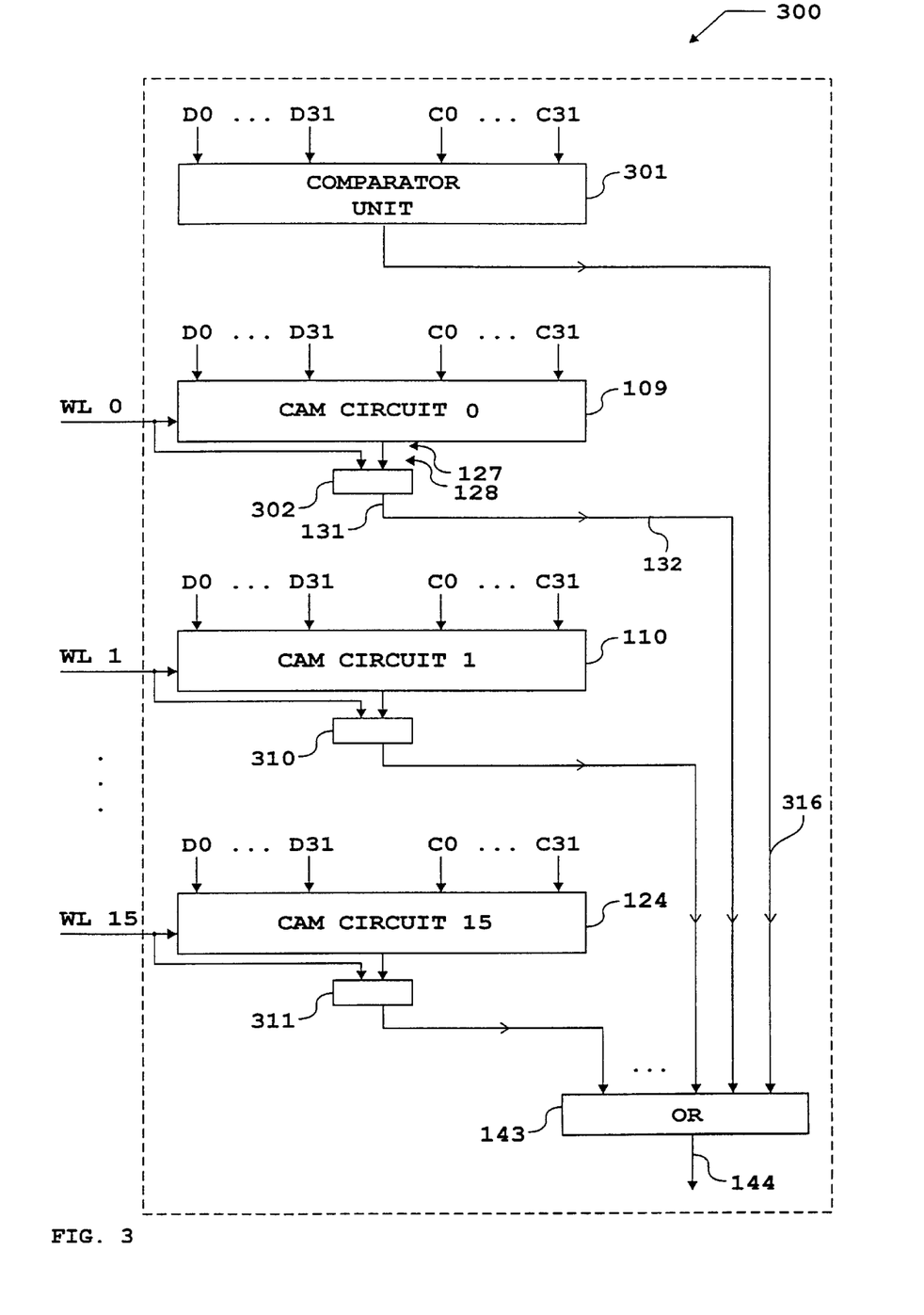
FIG. 3 schematically depicts a CAM according to the invention, which comprises a plurality of known CAM circuits and in addition a comparator unit and inhibiting means according to the invention.

FIG. 3 shows a CAM 300 according to the invention, which differs from the known CAM 100, shown in FIG. 1, only in that it additionally comprises a comparator unit 301 and inhibiting means 302, 310, 311. Each known CAM circuit 0, 1 to 15 (109, 110 to 124) is provided with a corresponding inhibiting means (detailed only shown for CAM circuits 0, 1 and 15), which will be described in more detail in conjunction with FIGS. 5 and 6.

Figure 4:
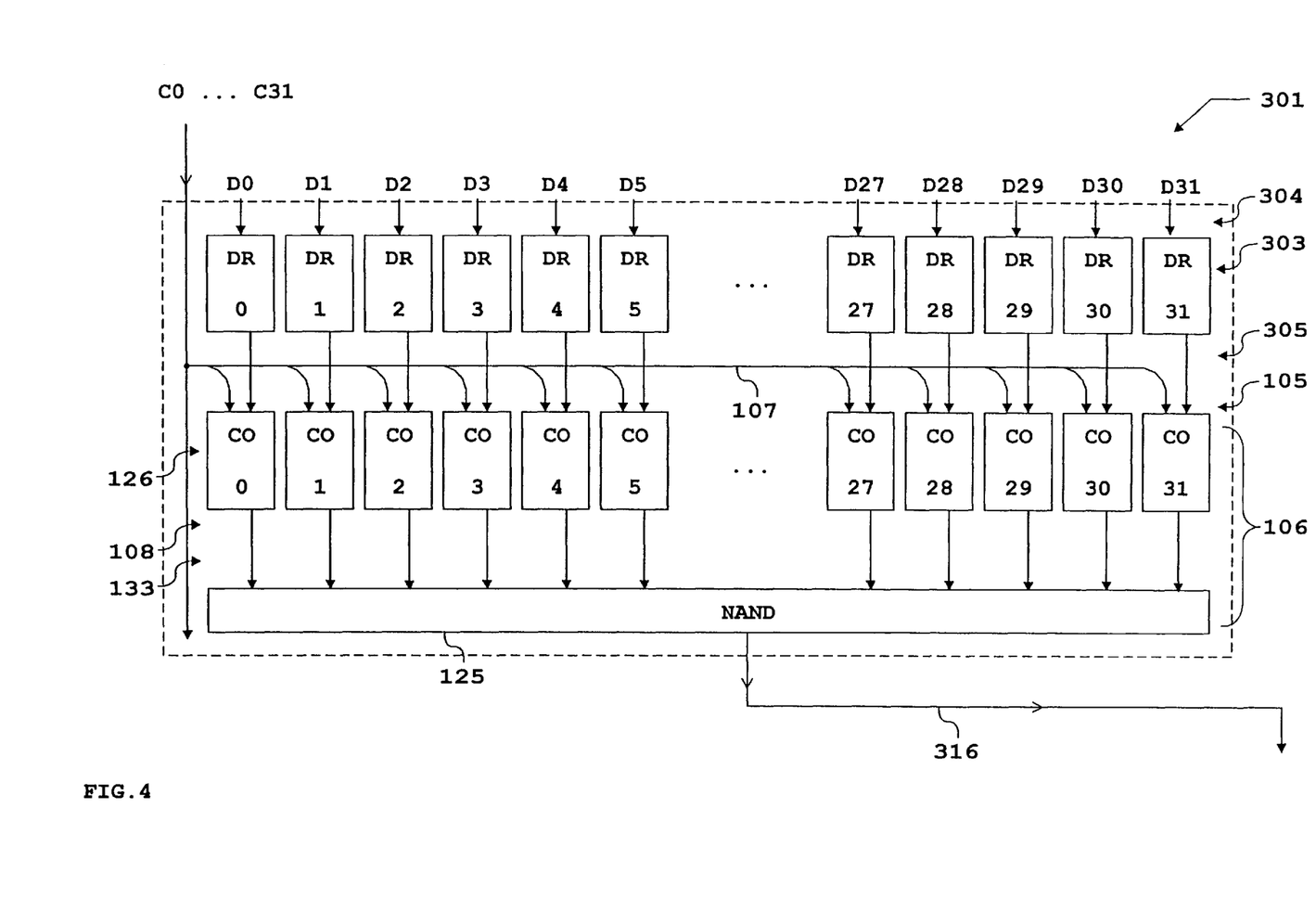
FIG. 4 shows the comparator unit depicted in FIG. 3 in more detail.

As shown in FIG. 4, the comparator unit 301 according to the invention differs from the CAM circuit 109, shown in FIG. 2, in that the comparator unit 301 does not comprise a memory circuit 102 and a corresponding write line but instead comprises a driver circuit 303 with a driver array with drivers DR 0 to DR 31. The CAM circuits 110 to 124 comprise the same hardware architecture as CAM circuit 109. The driver circuit 303 comprises driver input means 304 applying the input data D0 to D31 to the drivers of the driver circuit 303. Each output of the drivers 104 is connected with the data input 105 of a corresponding comparator of the compare circuit 106. Accordingly, each comparator in comparator array 126 of the comparator unit 301 compares the output data of the corresponding driver of driver circuit 303 with the corresponding compare bit of compare data C0 to C31 applied to the second input of each comparator in comparator array 126 via compare data input means 107.

In a preferred embodiment of the invention the comparators of comparator unit 301 are XOR-gates, i.e. exclusive OR-gates, like the comparators in comparator array 126 of the CAM circuits 0 to 15.

Figure 5:
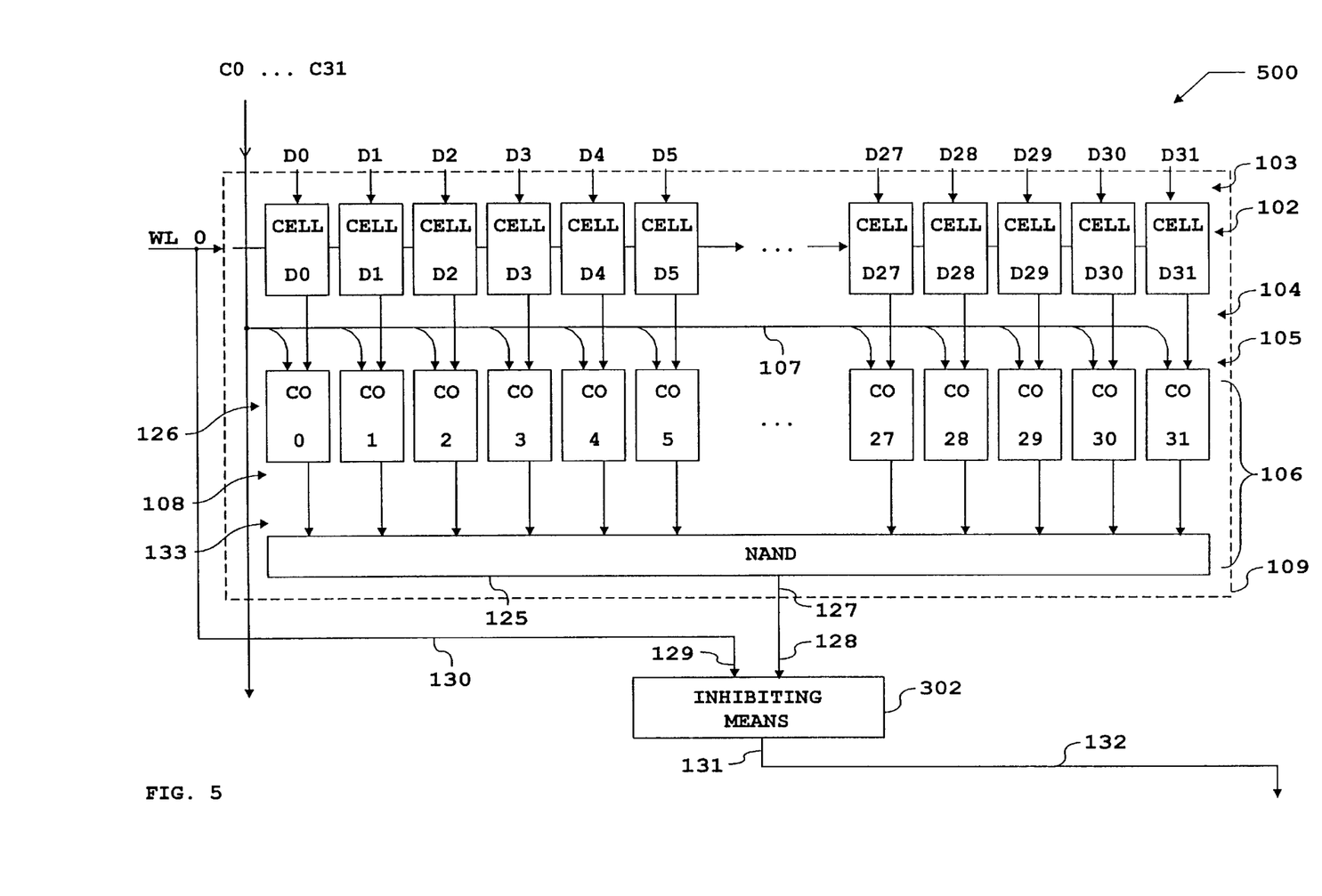
FIG. 5 is an arrangement comprising the known CAM circuit shown in FIG. 2 and first inhibiting means according to the invention.

As shown in FIG. 5 in more detail, the output 127 of NAND-gate 125 of CAM circuit 109 is applied to an input 128 of inhibiting means 302, preferably an AND-gate, and the write line 0 (WL 0) of memory circuit 102 of CAM circuit 109 is connected with a second input 129 of inhibiting means 302 via a line 130. The output 131 of inhibiting means 302 is applied to a corresponding input of the OR-gate 143, as shown in FIG. 3. The same applies to the other CAM circuits 1 to 15 (110 to 124), which also comprise the described inhibiting means arrangement.

In the following the operation of the CAM 300 according to the invention will be described. If the input data D0 to D31 shall substitute the data already stored in CAM circuit 0 (109), the write line 0 (WL 0) is activated to enable writing of the input data D0 to D31 into the memory circuit 102. All other write lines (WL 1 to WL 15 in the example shown in FIG. 3) comprise a signal disabling writing of the input data D0 to D31 into the memory circuits 102 of CAM circuit 1 to CAM circuit 15; the input data D0 to D31 is also applied to them. Since the write signal on write line 0 (WL 0) is applied to the input of inhibiting means 302 (see FIG. 5), after inverting the write signal by an inverter (not shown), the inhibiting means 302, preferably an AND-gate, generates an output signal 131 on line 132 representing that the input data D0 to D31 do not match the compare data C0 to C31, even if both data, i.e. 32-bit-words in this example, match. Preferably, the match signal is suppressed by the inhibiting means 302 in that an inverted write signal is applied to one of its inputs during the step or cycle in which the input data are clocked into the memory circuit 102. By this measure according to the invention, the generation of a potential wrong match signal during the step or cycle of storing the input data in the memory circuit 102 of CAM circuit 0 is avoided.

Advantageously, the comparator unit 301 temporarily "substitutes" compare circuit 106 in the CAM circuit 0 (109) in that the comparator unit 301 performs a comparison of the input data D0 to D31 with the compare data C0 to C31 when both data are applied in the same step or clock cycle. If the input data D0 to D31 are identical with the compare data C0 to C31, i.e. the input data match the compare data, the comparator unit 301 generates a match signal 316 which is applied to an input of the OR- gate 143.

The same applies with regard to writing of input data into any other of the CAM circuits 1 to 15 in further steps or clock cycles.

As has been described in detail, an important aspect of the invention is to provide a known CAM 100 with a comparator unit 301. The comparator unit 301 does not comprise a (slow) memory circuit 102 and therefore it is able to perform a comparison of input data D0 to D31 with compare data C0 to C31 in the same clock cycle or step, when both data are applied to the CAM and its shown components.

It will be understood that instead of the driver circuit 303 a sufficient fast memory circuit (not shown) may be used. In addition, the driver circuit 303 may be omitted, if the input data can be directly applied to the comparators of comparator unit 301.

A further important aspect of the invention is to temporarily inhibit forwarding of the output or match signal of the CAM circuit into which the input data D0 to D31 is written or stored, in order to avoid a wrong match signal.

Advantageously, wait cycles between storage and comparison, necessary for performing a valid or defined comparison of input data and compare data when input data are written in the CAM 100 according to the prior art, can be avoided. This allows to perform a lookup of data in the CAM 300 according to the invention within a lower amount of clock cycles than in the CAM 100 according to the prior art. In order to obtain the described speed improvement of data lookups, it is only necessary to provide the known CAM 100 with a single comparator unit 301 comprising a hardware architecture which preferably makes use of the compare circuit 106 already provided in each of the CAM circuits 0 to 15. In addition, the described inhibiting means for each CAM circuit can be easily implemented in the hardware layout of the known CAM 100.

Figure 6:
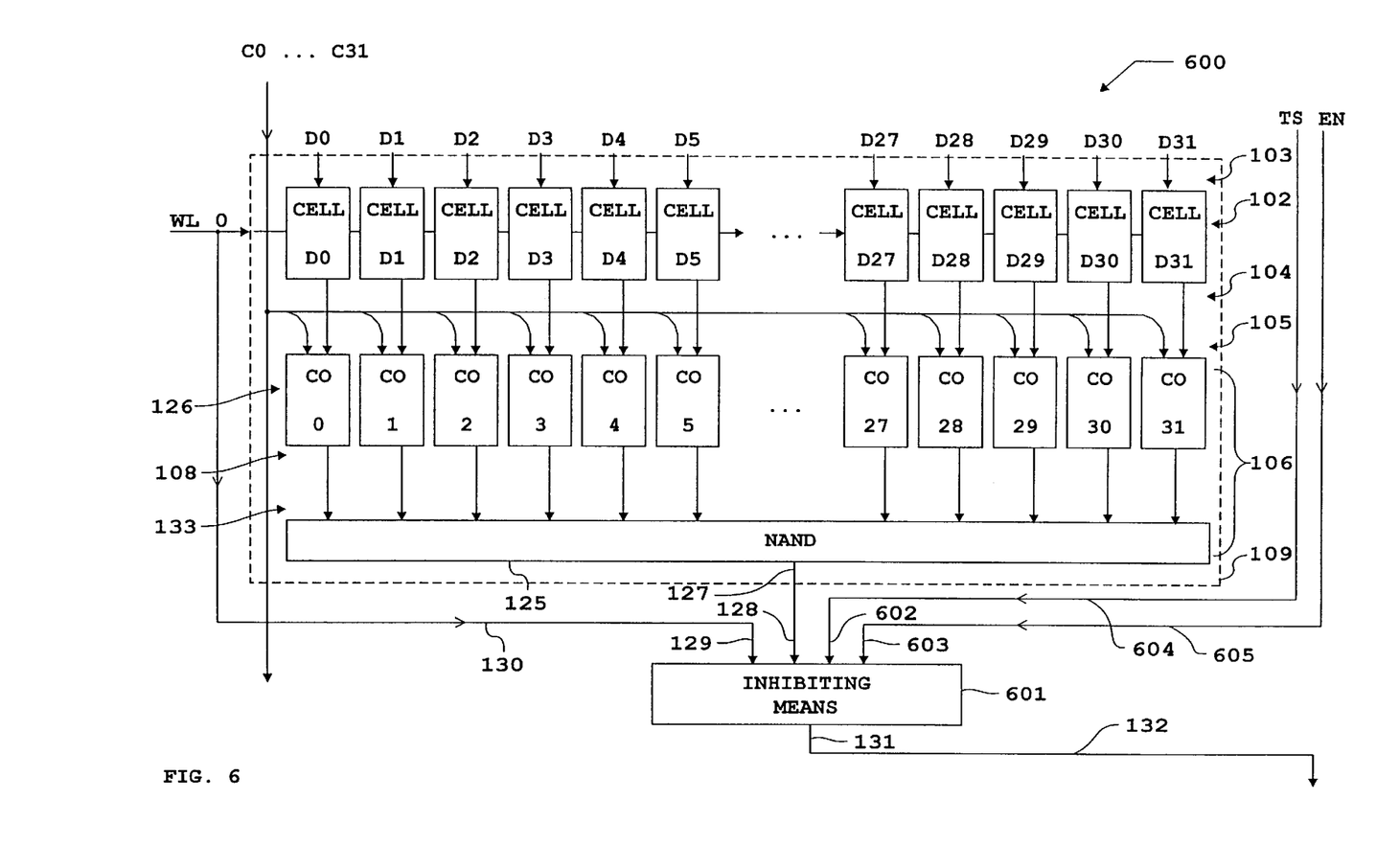
FIG. 6 is an arrangement comprising the known CAM circuit shown in FIG. 2 and second inhibiting means according to the invention.

FIG. 6 shows a preferred modification of the arrangement shown in FIG. 5. In FIG. 6 the inhibiting means 302, shown in FIG. 5, are substituted by an inhibiting means 601, also preferably an AND-gate, comprising two additional inputs with regard to the inhibiting means 302. The first additional input 602 is connected with a timing signal TS generated by the data processing system via a line 604. The timing signal TS allows the data processing system to time the blocking of the match signal generated by CAM circuit 109 (as well as of the other CAM circuits 110 to 124, since each CAM circuit 109, 110 to 124 is preferably provided with an inhibiting means 601 instead of an inhibiting means 302— not shown). An enable signal EN is applied to the other additional input of inhibiting means 601 via line 605, enabling or disabling forwarding of a match signal from inhibiting means 601 to OR-gate 143 and thereafter to the data processing system. The enable signal EN is generated and controlled by the data processing system.

Figure 7:
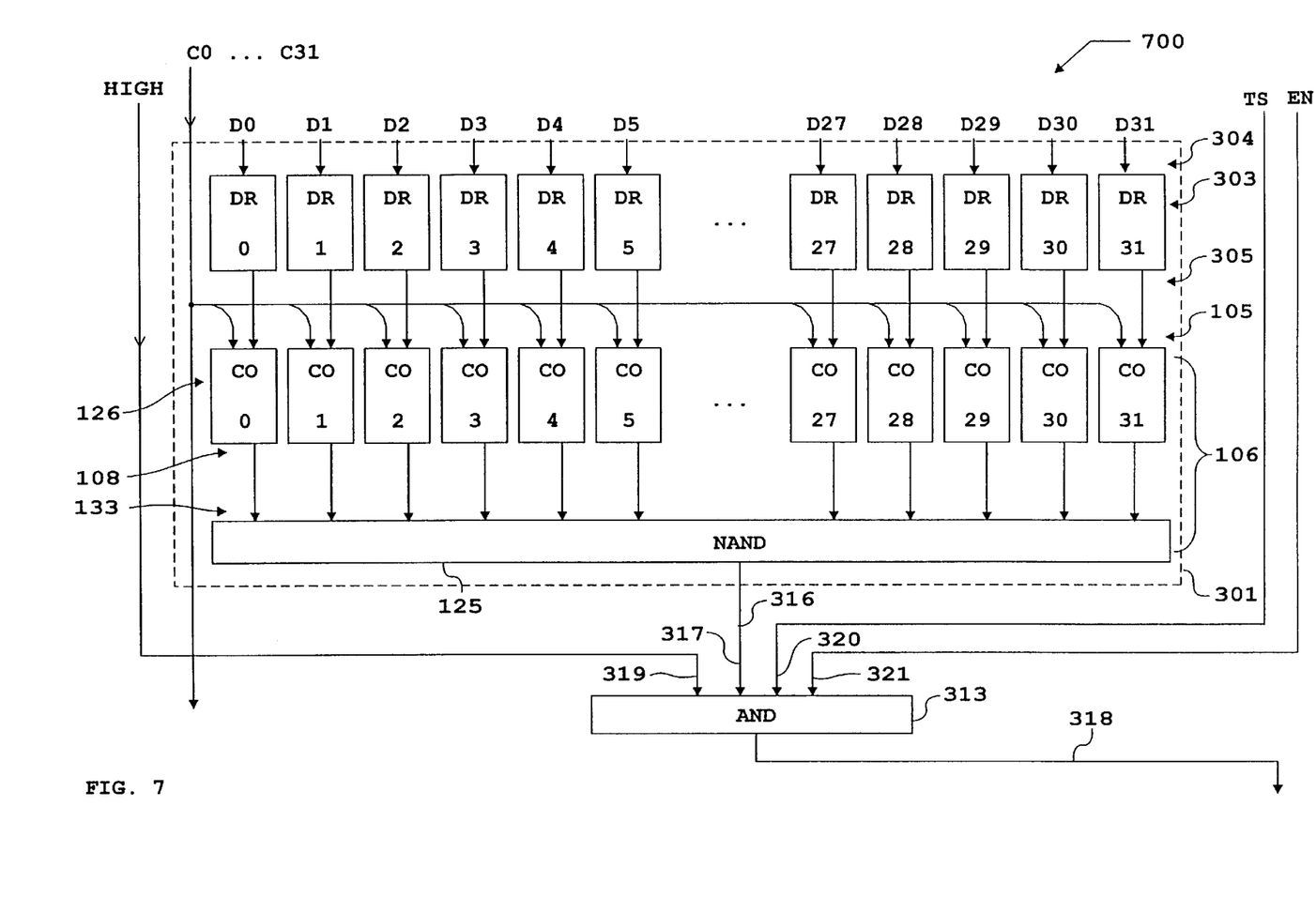
FIG. 7 illustrates a preferred embodiment of the comparator unit of FIG. 4 comprising an inhibiting means according to the invention.

As shown in FIG. 7, the comparator unit 301 according to the invention is preferably provided with an AND-gate 313. The output 316 of NAND-gate 125 is applied to input 317 of AND-gate 313. A high-level signal HIGH is applied to an input 319 of AND-gate 313. The timing signal TS generated by the data processing system is applied to a further input 320 of AND-gate 313 and the enable signal EN generated and controlled by the data processing system is applied to the input 321 of AND-gate 313.

Accordingly, by means of the timing signal TS as well as by means of the enable signal EN, the AND-gate 313 can be controlled by the data processing system to suppress a match signal generated by NAND-gate 125 to be forwarded to OR-gate 143 via line 318. Thereby, processing of a wrong or non-defined match signal forwarded to the data processing system via output line 144 of the OR-gate 143 can be avoided.

The present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method for data lookups in a clocked data processing system, comprising:

applying first input data to a specified memory circuit, said memory circuit comprising input means and output means;

storing said first input data in said memory circuit;

applying second input data to said specified memory circuit to be stored in said memory circuit and substituting said first input data;

applying the data present in said memory circuit to data input means of a first compare circuit via said output means of said memory circuit, and said first compare circuit comprising said first data input means, first compare data input means and first comparison result output means;

applying compare data to said first compare data input means, whereby said first compare circuit generates match signals on said first comparison result output means, if said data present in said memory circuit are identical to said compare data; and disregarding a match found of said data present in said memory circuit with said compare data at least in the step or clock cycle in which said second input data are stored in said specified memory circuit.

2. The method of claim 1, further comprising:

providing said second input data with store data specifying in which memory circuit said second input data shall be stored;

providing each memory circuit with at least one write line;

applying a write signal on said at least one write line of the memory circuit being specified by said store data, whereby said write signal enables writing of said second input data into the specified memory circuit, and said write signal inhibits to forward said match signals and/or to forward a single match signal generated by a logical AND- operation on said match signals to said data processing system and/or inhibits to apply the data present in the specified memory circuit to said first compare circuit and/or inhibits to apply said compare data to said first compare circuit.

3. The method of claim 1, further comprising:

applying said second input data to a driver circuit, said driver circuit comprising driver input means and driver output means, whereby said driver circuit generates driver output data corresponding to said second input data on said driver output means;

applying said driver output data to data input means of a second compare circuit and applying compare data to compare data input means of said second compare circuit, whereby said second compare circuit comprises said data input means, said compare data input means and comparison result output means; and generating at least one match signal on said comparison result output means by said second compare circuit, if said driver output data match with said compare data.

4. The method of claim 3, further comprising:

providing said second input data with store data specifying in which memory circuit said second input data shall be stored;

providing each memory circuit with at least one write line;

applying a write signal on said at least one write line of the memory circuit being specified by said store data, whereby said write signal enables writing of said second input data into the specified memory circuit, and said write signal inhibits to forward said match signals and/or to forward a single match signal generated by a logical AND- operation on said match signals to said data processing system and/or inhibits to apply the data present in the specified memory circuit to said first compare circuit and/or inhibits to apply said compare data to said first compare circuit.

5. A data processing system comprising means adapted for carrying out the steps of the method according to claim 4.

6. The data processing system of claim 5, wherein:

said driver circuit comprises a driver array;

said second compare circuit comprises a comparator array and a second gate;

the output lines of said comparator array are applied to corresponding input lines of said second gate; and said second gate comprises a single output line comprising said match signal.

7. The data processing system of claim 5, further comprising at least one content addressable memory, each comprising said memory circuit and said first compare circuit, and said first compare circuit comprising a first gate.

8. The data processing system of claim 7, wherein:

said driver circuit comprises a driver array;

said second compare circuit comprises a comparator array and a second gate;

the output lines of said comparator array are applied to corresponding input lines of said second gate; and said second gate comprises a single output line comprising said match signal.

9. The data processing system of claim 7, wherein said content addressable memory comprises inhibiting means inhibiting to forward one or more match signals to said data processing system and/or inhibiting to apply the data present in said memory circuit to said first compare circuit and/or inhibiting to apply said compare data to said first compare circuit.

10. The data processing system of claim 6, wherein said comparator array of said second compare circuit comprises a plurality of XOR-gates.

11. The data processing system of claim 6, further comprising a third gate comprising at least one input line and a single output line.

12. The data processing system of claim 11, wherein said write signal on said write line of the specified memory circuit or an inverted write signal is applied to one of the input lines of said third gate and blocks forwarding of one or more match signals generated by said second compare circuit to said data processing system.

13. The data processing system of claim 6, wherein said write signal on said write line of the specified memory circuit or an inverted write signal is applied to one of the input lines of said third gate and blocks forwarding of one or more match signals generated by said second compare circuit to said data processing system.

14. The data processing system of claim 5, wherein said write signal on said write line of the specified memory circuit or an inverted write signal is applied to one of the input lines of said third gate and blocks forwarding of one or more match signals generated by said second compare circuit to said data processing system.

15. A data processing system comprising means adapted for carrying out the steps of claim 1.

* * * * *